United States Patent
Okayasu et al.

(10) Patent No.: US 6,901,092 B2
(45) Date of Patent: May 31, 2005

(54) PACKAGE STRUCTURE FOR A HYBRID OPTICAL MODULE AND METHOD OF PRODUCING THE SAME

(75) Inventors: Masaki Okayasu, Saitama (JP); Shinnosuke Fukuda, Saitama (JP); Hirofumi Tanaka, Saitama (JP)

(73) Assignee: Pioneer Corporation, Tokyo (JP)

( * ) Notice: Subject to any disclaimer, the term of this patent is extended or adjusted under 35 U.S.C. 154(b) by 938 days.

(21) Appl. No.: 09/741,006

(22) Filed: Dec. 21, 2000

(65) Prior Publication Data

US 2003/0031429 A1 Feb. 13, 2003

(30) Foreign Application Priority Data

Dec. 28, 1999 (JP) .......................... P.11-375169

(51) Int. Cl.[7] .............. H01S 3/04; H01S 5/00
(52) U.S. Cl. .......................... 372/36; 343/43
(58) Field of Search ................... 372/36, 43

(56) References Cited

U.S. PATENT DOCUMENTS

| 5,285,062 A | | 2/1994 | Lee |
| 5,309,460 A | * | 5/1994 | Fujimaki et al. .............. 372/36 |
| 6,090,642 A | * | 7/2000 | Kamibayashi et al. ....... 438/116 |

FOREIGN PATENT DOCUMENTS

EP          0 851 414 A2     7/1998

* cited by examiner

Primary Examiner—James Vannucci
(74) Attorney, Agent, or Firm—Sughrue Mion, PLLC

(57) ABSTRACT

A resin package 1 is hollowed in order to house components of a hybrid optical module. Laser devices 7 and 8 are die-bonded to metal frames 2 and 3, respectively. Ends of the metal frames are bent, and then embedded into the resin package 1 as in-resin bent portions 4, 5, and 6. In a frame led-out portion 10, portions of the metal frames 2 and 3 are led out to the outside of the resin package 1. The led-out portion 10 is made in contact with a metal plate, an aluminum die cast member, or the like which is outside the package, whereby the heat radiation effect is improved.

6 Claims, 2 Drawing Sheets

2(3, 4, 5, 6, 7)

2(3, 4, 5, 6, 7)

10

PACKAGE STRUCTURE FOR A HYBRID OPTICAL MODULE AND METHOD OF PRODUCING THE SAME

BACKGROUND OF THE INVENTION

1. Field of the Invention

The present invention relates to a package structure for a hybrid optical module in which components of an optical pickup, excluding an objective lens are to be mounted, and also a method of producing it.

2. Description of the Related Art

Among devices constituting a CD player, an optical pickup which detects an optical signal is the heart of the CD player. With respect to such an optical pickup, requests for a reduced cost, a high reliability, and a reduced weight have been given. However, a conventional optical pickup which is configured by discrete components cannot meet such requests. Therefore, optical modules of a hybrid configuration which are called a hologram pickup or a laser coupler have begun to be used.

In such hybrid optical modules, particularly in a laser coupler, all parts other than an objective lens are integrated into one component, so as to extremely reduce the size of the module. Specifically, a photo diode IC substrate on which an optoelectric converting element is formed is used as a base, and a prism and a laser diode are mounted on the base, thereby configuring a laser coupler. The laser coupler is housed in a package which is not shown. An optical lens and mechanical parts such as an actuator are placed on the package to complete an optical pickup unit.

The package into which parts constituting the hybrid optical module are housed is made of a metal including ceramics, or a resin. The latter material is light in weight and suitable for miniaturization, but is inferior in mechanical strength and heat radiation property than a metal. A process of producing a hybrid optical module includes a heat treatment step in which the temperature is raised to a range of 180 to 200° C. Since the temperature range is immediately below the melting point of a plastic, the mechanical strength of a plastic is expected to be lowered.

In some cases, a plurality of laser devices which are used as light sources of a hybrid optical module of this kind are bonded onto a metal frame. When a laser device is to be die-bonded onto a metal frame, a heat treatment is conducted. The metal frame onto which a laser device is to be die-bonded is shared among the plural laser devices. During a process of die-bonding one laser device, therefore, the die-bonding state of another laser device may be adversely affected. In this case, misalignment of the optical axis is caused by heat applied in the process of die-bonding.

SUMMARY OF THE INVENTION

The invention has been conducted in view of the above-discussed circumstances. It is an object of the invention to provide a package structure for a hybrid optical module in which components of a hybrid optical module are mounted on a lead frame made of a metal, and the frame is bent in a resin, thereby enhancing the mechanical strength of a resin package, and the surface area of the frame is increased so that the heat capacity in terms of a heat sink is increased, and also a method of producing such a package structure.

It is another object of the invention to provide a package structure for a hybrid optical module in which, when a plurality of laser devices are to be bonded to a metal frame, the metal frame is independently disposed for each of the laser devices, so that, during a process of die-bonding one laser device, the die bonding of another laser device is not adversely affected and misalignment of the optical axis due to heat applied in the process of die-bonding can be suppressed, and also a method of producing such a package structure.

In order to solve the problems discussed above, the package structure for a hybrid optical module according to a first aspect of the invention is characterized in that the package structure comprises: components for detecting an optical signal, excluding an objective lens; a hollow resin package which houses the components for detecting an optical signal; and a metal frame a portion of which is mounted on the resin package, the components for detecting an optical signal being bonded onto the mounted portion, and another portion of which is vertically bent in accordance with a shape of the resin package and embedded into the resin package.

The package structure for a hybrid optical module according to a second aspect of the invention is characterized in that, in the structure of the first aspect of the invention, the components for detecting an optical signal constitute an optical pickup unit. The package structure for a hybrid optical module according to a third aspect of the invention is characterized in that, in the structure of the first or second aspect of the invention, the metal frame is independently disposed for each of laser devices which are to be bonded.

The package structure for a hybrid optical module according to a fourth aspect of the invention is characterized in that, in the structure of any one of the first to third aspects of the invention, the metal frame radiates heat via the resin package to a metal part disposed outside the resin package. The package structure for a hybrid optical module according to a fifth aspect of the invention is characterized in that, in the structure of any one of the first to fourth aspects of the invention, an end portion of the metal frame is led out from the resin package, and made in contact with a metal part disposed outside the resin package.

When a pickup component is to be die-bonded onto a metal frame, a heat treatment is conducted. In the above configuration, since the metal frame is disposed independently from a metal frame onto which a laser device is to be die-bonded, one laser device is not adversely affected by a process of die-bonding another laser device. Therefore, misalignment of the optical axis due to heat applied in the process of die-bonding can be suppressed. Since the metal frame is bent in the resin package, the strength of the resin package itself is enhanced. Furthermore, the surface area of the metal frame is increased, and hence the heat capacity in terms of a heat sink is increased. Since heat is radiated to the outside via the thin resin package or the frame led-out portion, the heat radiation effect is improved.

The method of producing a package structure for a hybrid optical module according to a sixth aspect of the invention is a method of producing a package structure comprising: a hollow resin package which houses components for detecting an optical signal, excluding an objective lens; and a metal frame a portion of which is mounted on the resin package, and onto which the components for detecting an optical signal are to be bonded, and is characterized in that the method comprises the steps of: vertically bending another portion of the metal frame in accordance with a shape of the resin package; embedding the other portion of the metal frame into the resin package, and then performing a shaping process; and bonding the components for detecting an optical signal onto the portion of the metal frame.

As described above, the other portion of the metal frame is vertically bent in accordance with the shape of the resin package, the other portion of the metal frame is then embedded into the resin package, and a shaping process is performed. The components of the hybrid optical module are mounted on a lead frame made of a metal, and the frame is bent in a resin, so that the mechanical strength of the resin package can be enhanced. The surface area of the frame is increased, whereby the heat capacity in terms of a heat sink can be increased.

DETAILED DESCRIPTION OF THE PREFERRED EMBODIMENTS

Now, a description will be given in more detail of preferred embodiments of the invention with reference to the accompanying drawings.

Figure 1:
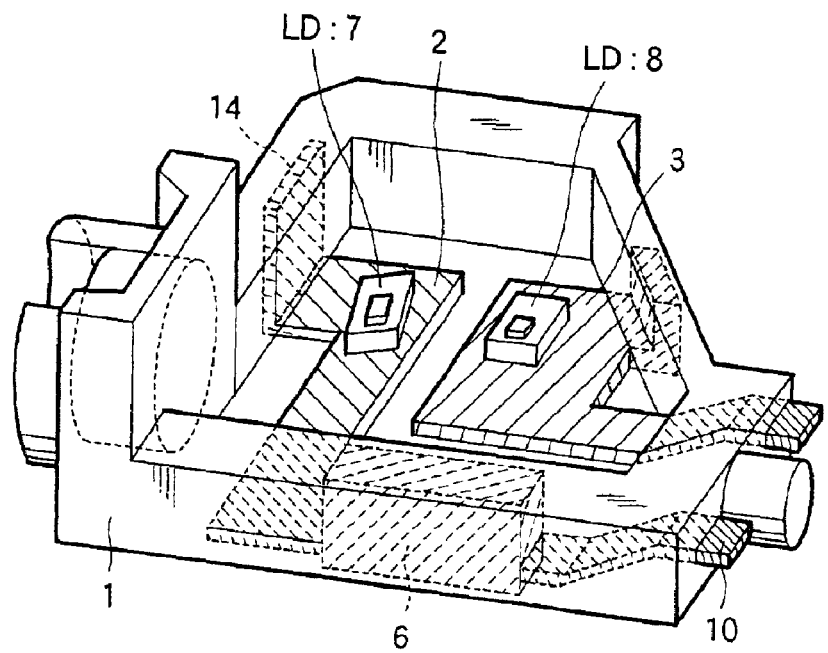
FIG. 1 is a view showing a package structure for a hybrid optical module according to the invention.

FIG. 1 is a view showing an embodiment of the package structure for a hybrid optical module according to the invention.

Referring to the figure, 1 denotes a resin package which is hollowed in order to house components of a hybrid optical module. The reference numeral 2 denotes a lead frame for die-bonding a laser device (LD 7), and 3 denotes a lead frame for die-bonding a laser device (LD 8). Ends of the lead frames are bent, and then embedded into the resin package 1 as in-resin bent portions 4, 5, and 6.

The reference numeral 10 denotes a frame led-out portion through which portions of the lead frames 2 and 3 are led out to the outside of the resin package 1. The led-out portion 10 is made in contact with a metal plate, an aluminum die cast member, or the like which is outside the package, whereby the heat radiation effect can be improved.

In the configuration, when the laser devices 7 and 8 are to be die-bonded respectively onto the lead frames 2 and 3, a heat treatment is conducted at 180 to 200° C. The lead frame 2 is disposed independently from the lead frame 3 onto which the laser device 8 is to be die-bonded. During a process of die-bonding one laser device 7 (8), therefore, the other laser device 8 (7) is not adversely affected. Consequently, misalignment of the optical axis due to heat applied in the process of die-bonding can be suppressed.

The lead frames 2 and 3 are bent in the resin package 1, and the bent portions exist as the in-resin bent portions 4, 5, and 6. Therefore, the strength of the resin package 1 itself is enhanced. Furthermore, the surface area of the metal frame is increased, and hence the heat capacity in terms of a heat sink is increased. Since heat is radiated to the outside via the frame led-out portion 10, the heat radiation effect is further improved.

The frame led-out portion 10 is requested not to impede a rotation mechanism for adjusting a grating. Therefore, the frame led-out portion 10 must be placed so as to be rotatable in balance. In the embodiment of the invention shown in FIG. 1, the frame led-out portion is bent at a midpoint. The embodiment has the structure in which the frame led-out portion 10 is made in contact with a heat sink disposed outside the resin package 1 so as to radiate heat to the external. In this case, however, it is not necessary to make the frame led-out portion in direct contact with the heat sink. Even when direct contact is not made, the frame led-out portion can contribute to heat radiation through a thin resin layer.

Figure 2:
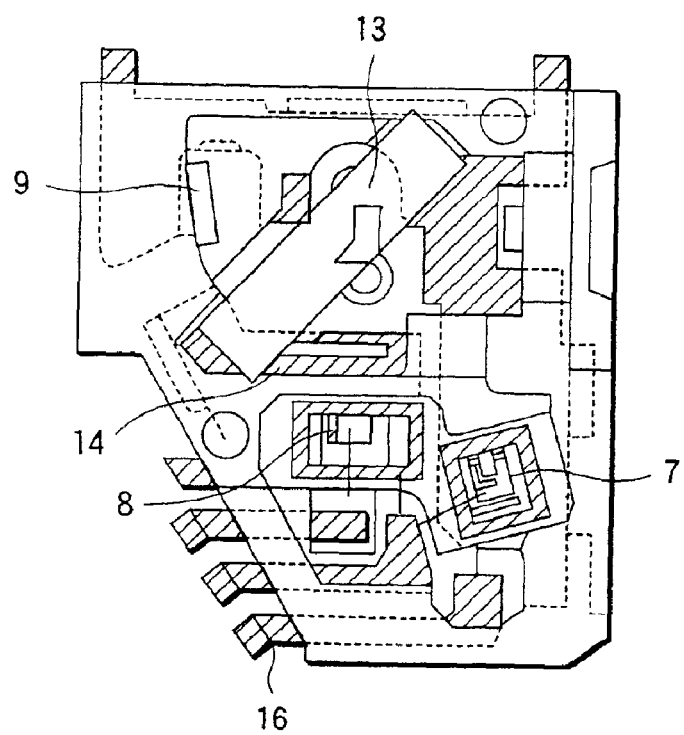
FIG. 2 is a view showing relationships between hybrid optical module components to be mounted in a resin package shown in FIG. 1, and lead frames.

FIG. 2 is a view showing components of the hybrid optical module which are to be mounted in the resin package shown in FIG. 1. In FIG. 2, hybrid optical module components which are to be mounted on lead frames are mainly shown, FIG. 3A denotes a plate (upper lead frame), and FIG. 3B denotes a case (lower lead frame).

In the figure, members identical with those of FIG. 1 are denoted by the same reference numerals. Referring to FIG. 2, 11 denotes a monitor PD which is an optical detector for monitoring the laser output, 12 denotes an optoelectric converting element (OEIC) which is bonded to the plate, 13 denotes a prism which combines light beams emitted from the laser devices 7 and 8, separates emitted and return light beams, and corrects aberration, 14 denotes a grating which divides the light beam from the laser device 7 into three beams, 15 denotes a frame for the plate, and 16 denotes a frame for the case.

Figure 3A:
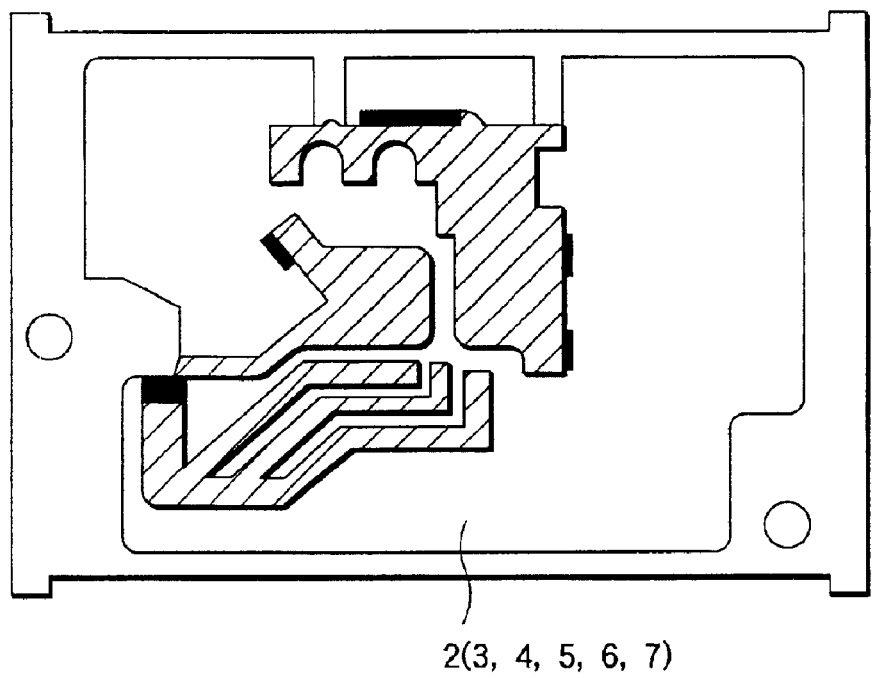
FIGS. 3A and 3B are views which is used for describing the method of producing a resin package for a hybrid optical module according to the invention.
Figure 3B:
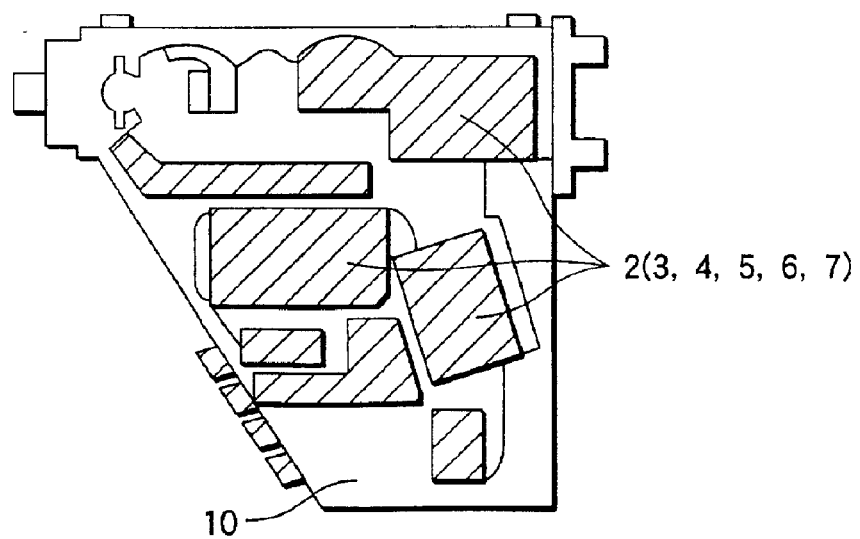

FIGS. 3A and 3B are views which is used for describing the method of producing a resin package for a hybrid optical module according to the invention. FIG. 3A shows lead frames 2 and 3 (4, 5, 6, 7) in which end portions have not yet been bent, and which are formed by punching out one thin copper plate by a press machine, and FIG. 3B shows the interior of a case in the state where the lead frames 2 and 3 (4, 5, 6, 7) are mounted into the resin package 1. The figure corresponds to the state where the hybrid optical module components shown in FIG. 2B are removed away. Namely, the hybrid optical module components shown in FIG. 2B are mounted on the lead frame shown in FIGS. 3A and 3B.

The method of producing a resin package for a hybrid optical module according to the invention will be described. First, portions of the lead frames shown in FIG. 3A are vertically bent in accordance with a shape of the resin package. The portions of the lead frames are embedded into the resin package 1, and a shaping process is then performed. The hybrid optical module components are housed in the completed resin package. Specifically, the laser diodes 7 and 8 are die-bonded onto other portions of the lead frames as shown in FIG. 2, and the optical components such as the prism are mounted at predetermined positions.

As described above, in the invention, components of a hybrid optical module are mounted on a lead frame made of a metal, and the frame is bent in a resin, thereby enhancing the mechanical strength of a resin package, and the surface area of the frame is increased so that the heat capacity in terms of a heat sink can be increased.

When a pickup component, particularly a laser device is to be die-bonded onto a metal frame, a heat treatment is conducted. As described above, according to the invention, the metal frame is disposed independently from a metal frame onto which another laser device is to be die-bonded, and hence one laser device is not adversely affected by a process of die-bonding another laser device. Therefore, misalignment of the optical axis due to heat applied in the process of die-bonding can be suppressed. Since the metal frame is bent in the resin package, the strength of the resin package itself is enhanced. Furthermore, the surface area of the metal frame is increased, and the heat capacity in terms of a heat sink is therefore increased. Since heat is radiated to the outside via the frame led-out portion or the thin resin package, the heat radiation effect is improved.

What is claimed is:

1. A package structure for a hybrid optical module, comprising:
    components for detecting an optical signal, excluding an objective lens;
    a hollow resin package which houses said components for detecting an optical signal; and
    a metal frame a portion of which is mounted on said resin package, said components for detecting an optical signal being bonded onto said mounted portion, and another portion of which is embedded into said resin package and is vertically bent inside said resin package in accordance with a shape of said resin package.

2. A package structure for a hybrid optical module according to claim 1, wherein said components for detecting an optical signal constitute an optical pickup unit.

3. A package structure for a hybrid optical module according to claim 1, wherein said metal frame is independently disposed for each of laser devices which are to be bonded.

4. A package structure for a hybrid optical module according to claim 1, wherein said metal frame radiates heat via said resin package to a metal part disposed outside said resin package.

5. A package structure for a hybrid optical module according to claim 1, wherein an end portion of said metal frame is led out from said resin package, and made in contact with a metal part disposed outside said resin package.

6. A method of producing a package structure for a hybrid optical module, said package comprising: a hollow resin package which houses components for detecting an optical signal, excluding an objective lens; and a metal frame a portion of which is mounted on said resin package, and onto which said components for detecting an optical signal are to be bonded, wherein said method comprises the steps of:

vertically bending another portion of said metal frame in accordance with a shape of said resin package;

embedding said other portion of said metal frame into said resin package, and then performing a shaping process; and bonding said components for detecting an optical signal onto said portion of said metal frame.

* * * * *